United States Patent
Ito et al.

(10) Patent No.: US 12,159,882 B2
(45) Date of Patent: Dec. 3, 2024

(54) DISPLAY DEVICE

(71) Applicant: KYOCERA CORPORATION, Kyoto (JP)

(72) Inventors: Hiroaki Ito, Ritto (JP); Takanobu Suzuki, Itami (JP)

(73) Assignee: KYOCERA COPORATION, Kyoto (JP)

( * ) Notice: Subject to any disclaimer, the term of this patent is extended or adjusted under 35 U.S.C. 154(b) by 240 days.

(21) Appl. No.: 17/779,381

(22) PCT Filed: Nov. 27, 2020

(86) PCT No.: PCT/JP2020/044372
§ 371 (c)(1),
(2) Date: May 24, 2022

(87) PCT Pub. No.: WO2021/107145
PCT Pub. Date: Jun. 3, 2021

(65) Prior Publication Data
US 2022/0399380 A1 Dec. 15, 2022

(30) Foreign Application Priority Data

Nov. 29, 2019 (JP) ................. 2019-216102

(51) Int. Cl.
*H01L 27/12* (2006.01)
*H01L 23/00* (2006.01)
*H01L 25/16* (2023.01)

(52) U.S. Cl.
CPC .......... *H01L 27/1244* (2013.01); *H01L 24/05* (2013.01); *H01L 24/06* (2013.01);
(Continued)

(58) Field of Classification Search
CPC ......... H01L 24/04–09; H01L 24/26–33; H01L 2224/04–095; H01L 2224/26–33505;
(Continued)

(56) References Cited

U.S. PATENT DOCUMENTS

| | | | |
|---|---|---|---|
| 2012/0044231 A1* | 2/2012 | Park | G06F 1/263 |
| | | | 345/211 |
| 2015/0228666 A1* | 8/2015 | Paolini, Jr. | G02F 1/13452 |
| | | | 257/72 |

(Continued)

FOREIGN PATENT DOCUMENTS

| | | |
|---|---|---|
| CN | 109003996 A | 12/2018 |
| EP | 1416460 A1 | 5/2004 |

(Continued)

*Primary Examiner* — Moin M Rahman
*Assistant Examiner* — Eric Manuel Mulero Flores
(74) *Attorney, Agent, or Firm* — Procopio, Cory, Hargreaves & Savitch LLP

(57) ABSTRACT

A display device includes a plate-like substrate having a first surface and a second surface, pixel units on the first surface, and a power supply voltage feeder on the second surface. The power supply voltage feeder outputs first and second power supply voltages applicable to the pixel units. The second power supply voltage is lower in potential than the first power supply voltage. The display device includes a first wiring conductor electrically connecting the power supply voltage feeder and the pixel units and a second wiring conductor electrically connecting the power supply voltage feeder and the pixel units. At least one of the first or second wiring conductor includes a planar conductive portion covering the first surface. The planar conductive portion includes connectors connected to the power supply voltage feeder on at least two sides of the substrate.

11 Claims, 10 Drawing Sheets

(52) U.S. Cl.
CPC ............ *H01L 25/167* (2013.01); *H01L 24/08* (2013.01); *H01L 2224/05011* (2013.01); *H01L 2224/05013* (2013.01); *H01L 2224/05018* (2013.01); *H01L 2224/05073* (2013.01); *H01L 2224/05082* (2013.01); *H01L 2224/05083* (2013.01); *H01L 2224/05124* (2013.01); *H01L 2224/05138* (2013.01); *H01L 2224/05139* (2013.01); *H01L 2224/05147* (2013.01); *H01L 2224/05155* (2013.01); *H01L 2224/05166* (2013.01); *H01L 2224/05171* (2013.01); *H01L 2224/0518* (2013.01); *H01L 2224/05558* (2013.01); *H01L 2224/05562* (2013.01); *H01L 2224/05573* (2013.01); *H01L 2224/05686* (2013.01); *H01L 2224/06051* (2013.01); *H01L 2224/06181* (2013.01); *H01L 2224/08123* (2013.01); *H01L 2224/08145* (2013.01); *H01L 2924/0106* (2013.01); *H01L 2924/0132* (2013.01); *H01L 2924/0549* (2013.01); *H01L 2924/12041* (2013.01)

(58) Field of Classification Search
CPC ......... H01L 25/075–0756; H01L 25/10; H01L 25/167; H01L 27/124–1244; H01L 27/15–156; H01L 33/00–648; H01L 2933/00–0091; H01L 33/36–387; H01L 33/62; H01L 2924/0106; H01L 2924/0132; H01L 2924/0549; H01L 2924/12041; H01L 23/52–5286; H01L 23/535; H01L 27/14603–14616; G09G 3/2003–2096; G09G 2300/0404–0434; G09G 2300/06; G09G 2300/08–0871; G09G 3/30–320434; G09G 3/06; G09G 3/08–0871; G09G 2330/00–028; G02F 1/1345–13458; G02F 1/133388; G06F 1/189; G06F 1/26–3296; G09F 9/30–302; H04N 5/66; H05B 33/02; H05B 33/06; H10K 59/82–82

See application file for complete search history.

(56) References Cited

U.S. PATENT DOCUMENTS

| | | | |
|---|---|---|---|
| 2017/0162608 A1* | 6/2017 | Yamazaki | G02F 1/1368 |
| 2018/0014399 A1* | 1/2018 | Chung | H05K 1/189 |
| 2018/0342654 A1* | 11/2018 | Chen | H01L 33/483 |
| 2019/0245126 A1* | 8/2019 | Lim | H01L 33/36 |
| 2019/0305072 A1* | 10/2019 | Park | G09G 3/3233 |
| 2020/0035750 A1 | 1/2020 | Li | |
| 2020/0135126 A1 | 4/2020 | Yokoyama et al. | |

FOREIGN PATENT DOCUMENTS

| | | |
|---|---|---|
| JP | 2003-58074 A | 2/2003 |
| JP | 2005-189676 A | 7/2005 |
| JP | 2016-186649 A | 10/2016 |
| WO | 2019/167966 A1 | 9/2019 |

* cited by examiner

DISPLAY DEVICE

FIELD

The present disclosure relates to a display device.

BACKGROUND

A known technique is described in, for example, Patent Literature 1.

CITATION LIST

Patent Literature

Patent Literature 1: Japanese Unexamined Patent Application Publication No. 2016-186649

BRIEF SUMMARY

A display device according to one or more aspects of the present disclosure includes a substrate having a first surface and a second surface opposite to the first surface, a plurality of pixel units on the first surface, and a power supply voltage feeder on the second surface. The power supply voltage feeder outputs a first power supply voltage and a second power supply voltage applicable to the plurality of pixel units. The second power supply voltage is lower in potential than the first power supply voltage. The display device includes a first wiring conductor electrically connecting the power supply voltage feeder and the plurality of pixel units to apply the first power supply voltage to the plurality of pixel units and a second wiring conductor electrically connecting the power supply voltage feeder and the plurality of pixel units to apply the second power supply voltage to the plurality of pixel units. At least one of the first wiring conductor or the second wiring conductor includes a planar conductive portion covering the first surface. The planar conductive portion includes connectors connected to the power supply voltage feeder on at least two sides of the substrate.

BRIEF DESCRIPTION OF DRAWINGS

The objects, features, and advantages of the present disclosure will become more apparent from the following detailed description and the drawings.

DETAILED DESCRIPTION

A known display device with the structure that forms the basis of a display device according to one or more embodiments of the present disclosure includes multiple pixel units including, for example, light-emitting diodes or organic electroluminescent (EL) elements (e.g., Patent Literature 1). Such a display device includes a substrate that includes terminals for providing power supply voltage signals to the pixel units in a peripheral portion along one side of the substrate.

In the display device with the structure that forms the basis of the display device according to one or more embodiments of the present disclosure, a potential difference between a high-potential power supply voltage and a low-potential power supply voltage may vary across the display surface. This may cause image quality deterioration such as unevenness in luminance or color.

A display device according to one or more embodiments of the present disclosure will now be described with reference to the drawings. Each figure referred to below shows main components and other elements of the display device according to the embodiments of the present disclosure. The display device according to the embodiments of the present disclosure may thus include known components not shown in the figures, such as circuit boards, wiring conductors, control integrated circuits (ICs), and large-scale integration (LSI) circuits.

Figure 1A:
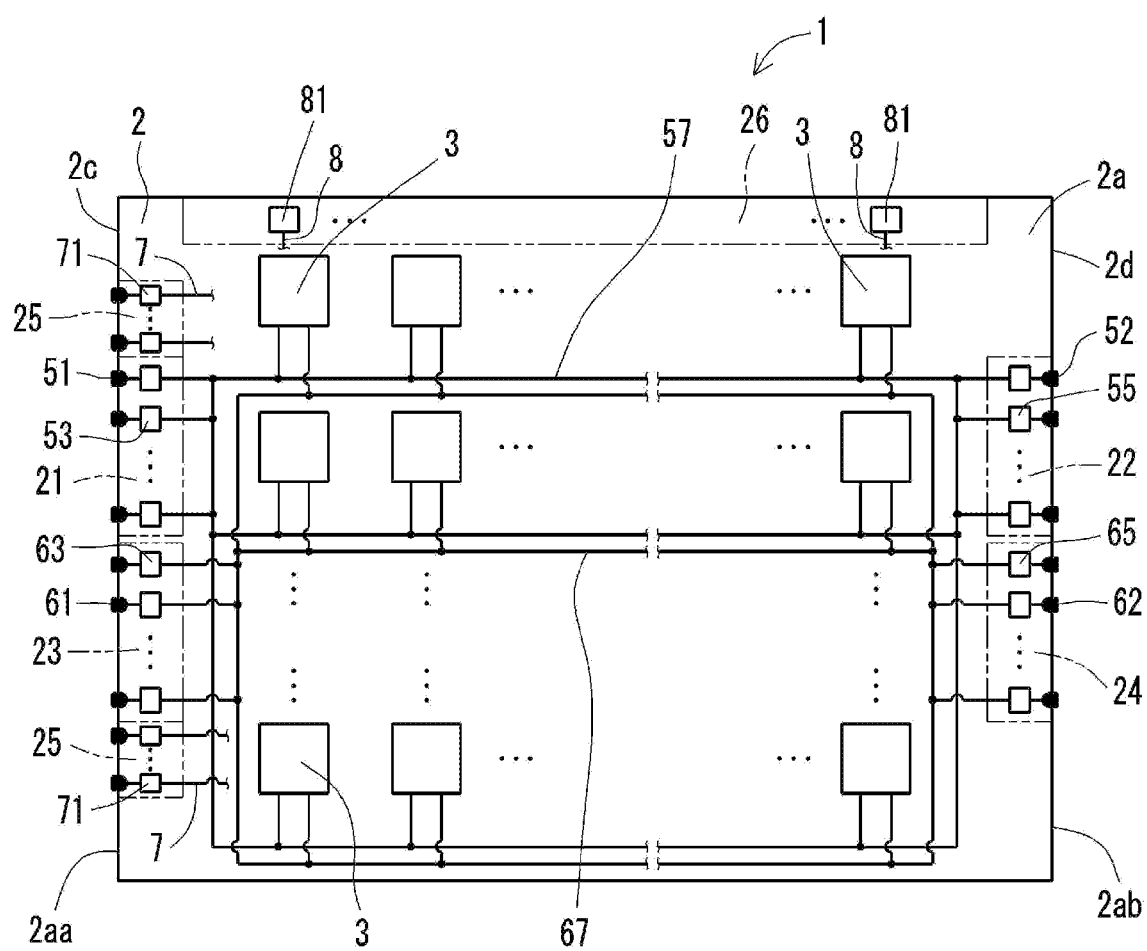
FIG. 1A is a schematic plan view of a display device according to one embodiment of the present disclosure.
Figure 1B:
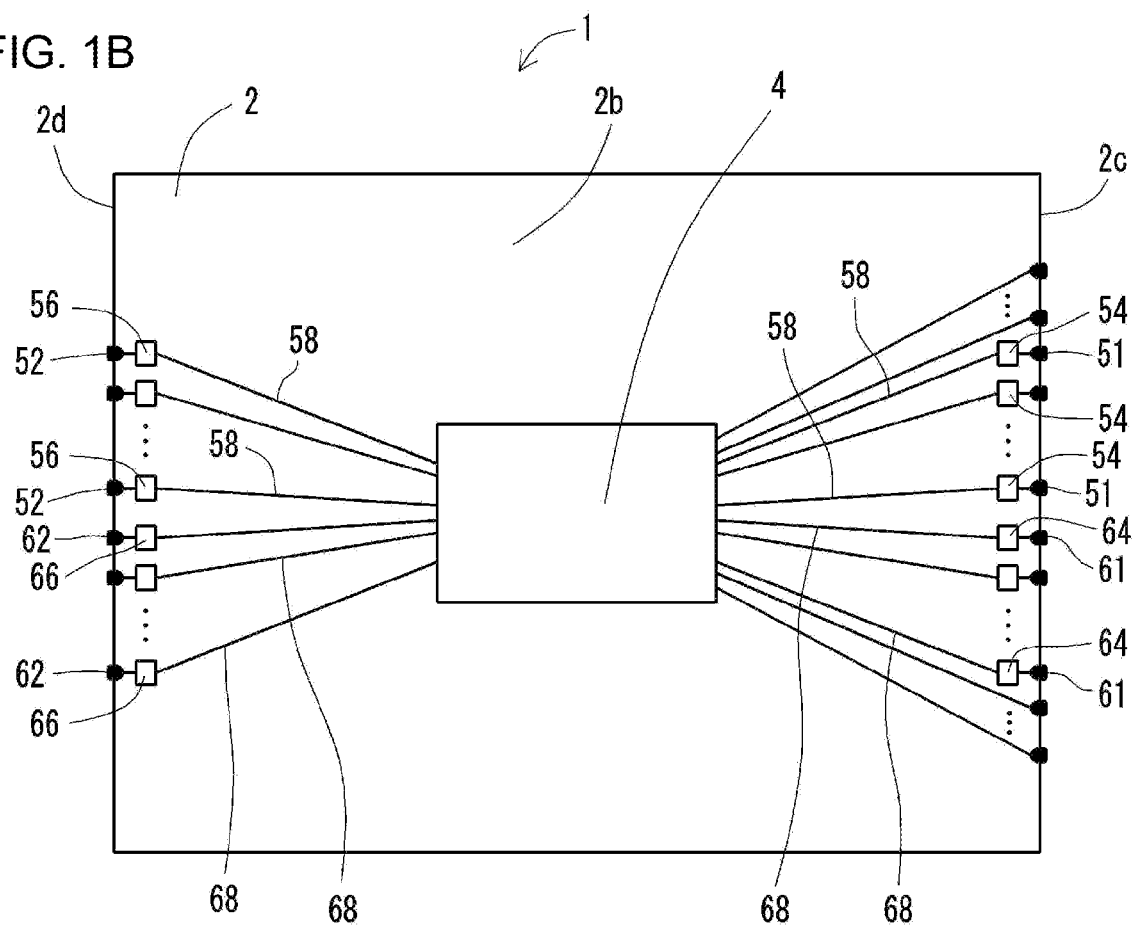
FIG. 1B is a schematic plan view of the display device according to the embodiment of the present disclosure as viewed in a direction different from the direction in FIG. 1A.
Figure 2A:
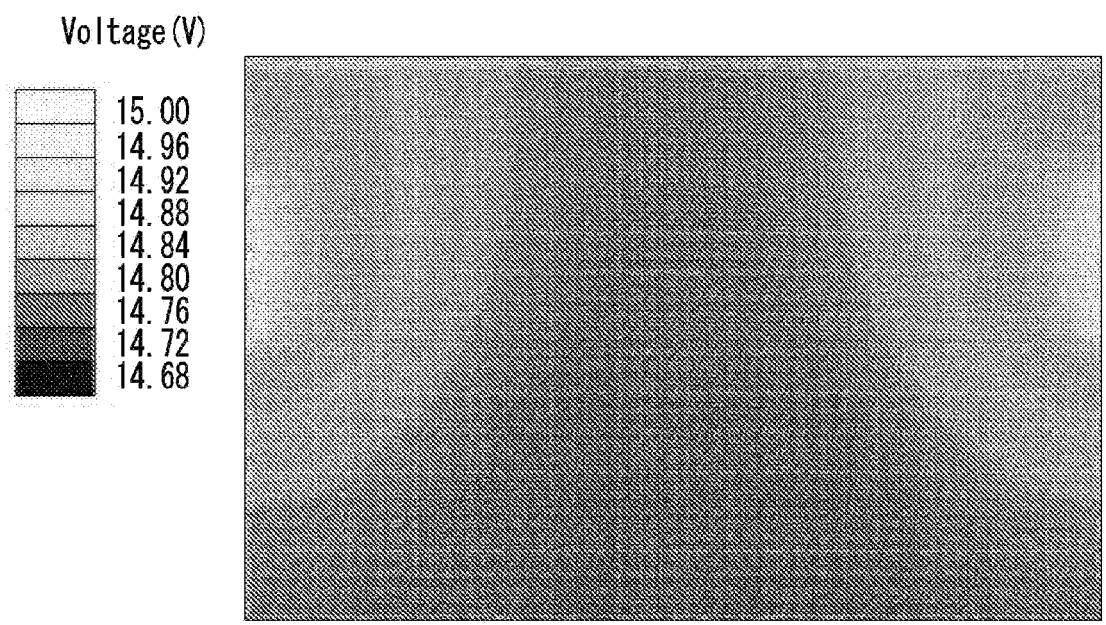
FIG. 2A is a diagram showing the voltage distribution of a first power supply voltage across a first surface of the display device according to the embodiment of the present disclosure.
Figure 2B:
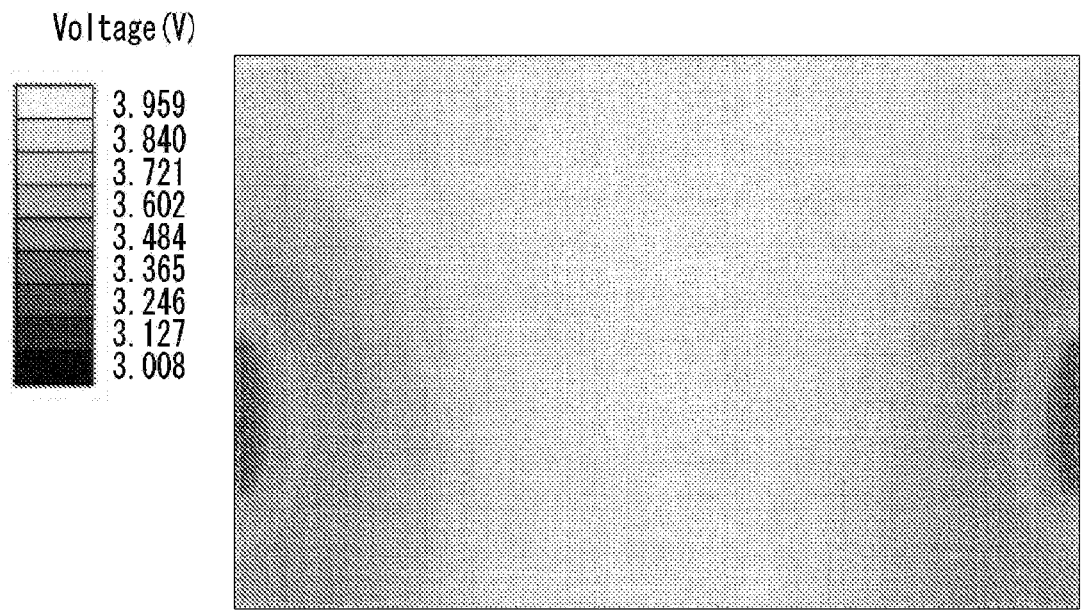
FIG. 2B is a diagram showing the voltage distribution of a second power supply voltage across the first surface of the display device according to the embodiment of the present disclosure.
Figure 3A:
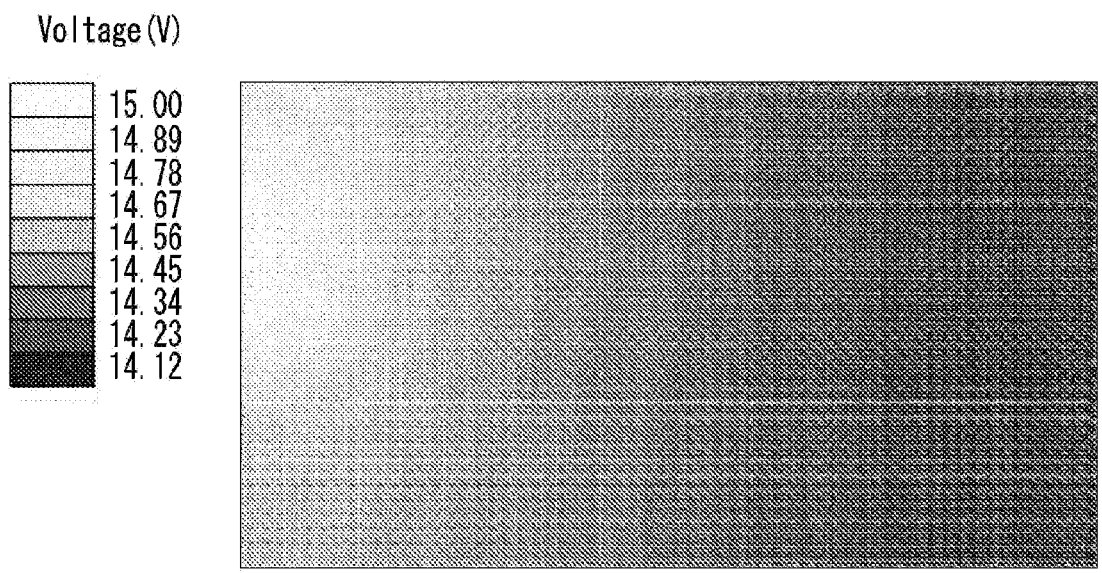
FIG. 3A is a diagram showing the voltage distribution of a first power supply voltage across a first surface of a display device in a comparative example.
Figure 3B:
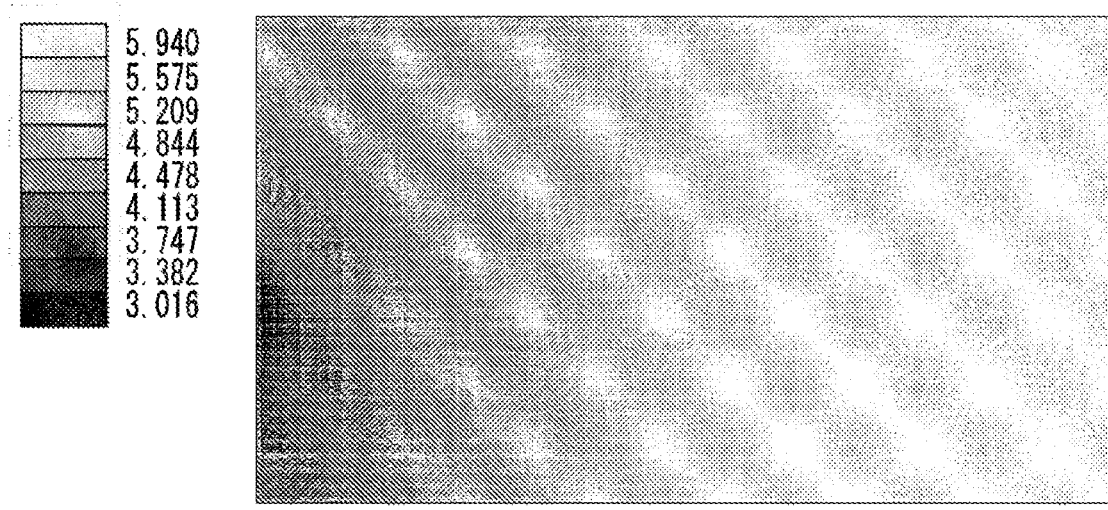
FIG. 3B is a diagram showing the voltage distribution of a second power supply voltage across the first surface of the display device in the comparative example.

FIG. 1A is a schematic plan view of a display device according to one embodiment of the present disclosure as viewed from a first surface. FIG. 1B is a schematic plan view of the display device according to the embodiment of the present disclosure as viewed from a second surface. FIG. 2A is a diagram showing the voltage distribution of a first power supply voltage across the first surface of the display device according to the embodiment of the present disclosure. FIG. 2B is a diagram showing the voltage distribution of a second power supply voltage across the first surface of the display device according to the embodiment of the present disclosure. FIG. 3A is a diagram showing the voltage distribution of a first power supply voltage across a first surface of a display device in a comparative example. FIG. 3B is a diagram showing the voltage distribution of a second power supply voltage across the first surface of the display device in the comparative example.

A display device 1 includes a substrate 2, multiple pixel units 3, a power supply voltage feeder 4, a first wiring conductor 5, and a second wiring conductor 6.

The substrate 2 is, for example, a transparent or opaque glass substrate, a plastic substrate, or a ceramic substrate. The substrate 2 is a rectangular plate. The substrate 2 has a first surface 2a and a second surface 2b opposite to the first surface 2a. The substrate 2 has a third surface 2c including a first side 2aa of the first surface 2a and connecting the first surface 2a and the second surface 2b, and a fourth surface 2d opposite to the third surface 2c. The substrate in one or more embodiments of the present invention may be a polygonal plate. The substrate may not be rectangular, and may be hexagonal or octagonal.

The substrate 2 includes a first area 21 extending from an edge portion along the first side 2aa on the first surface 2a over the third surface 2c and to the second surface 2b. The substrate 2 includes a second area 22 extending from an edge portion along a second side 2ab facing the first side 2aa on the first surface 2a over the fourth surface 2d and to the second surface 2b. The first wiring conductor 5 is located in the first area 21 and the second area 22. As described later, the first wiring conductor 5 connects the power supply voltage feeder 4 and each pixel unit 3 and applies a first power supply voltage, which is a high voltage, to each pixel unit 3.

The substrate 2 includes a third area 23 extending from an edge portion along the first side 2aa on the first surface 2a over the third surface 2c and to the second surface 2b. The substrate 2 includes a fourth area 24 extending from an edge portion along the second side 2ab on the first surface 2a over the fourth surface 2d and to the second surface 2b. The second wiring conductor 6 is located in the third area 23 and the fourth area 24. The second wiring conductor 6 connects the power supply voltage feeder 4 and each pixel unit 3 and applies a second power supply voltage, which is a voltage lower than the first power supply voltage, to each pixel unit 3.

In the present embodiment, the first surface 2a of the substrate 2 is rectangular, and the first side 2aa and the second side 2ab are the short sides of the first surface 2a, as shown in, for example, FIGS. 1A and 1B.

The pixel units 3 are on the first surface 2a of the substrate 2. The pixel units 3 are arranged in a matrix as viewed in a direction orthogonal to the first surface 2a. Each pixel unit 3 includes at least one light emitter 31. Each pixel unit 3 includes, for example, a thin-film transistor (TFT) as a switch, a TFT as a driving element, and a capacitor.

The light emitter 31 is a self-luminous light emitter such as a micro-light-emitting diode (LED), an EL element, an inorganic EL element, or a semiconductor laser element. In the present embodiment, the light emitter 31 is a micro-LED. The micro-LED may be rectangular as viewed in plan, or in other words, in the direction orthogonal to the first surface 2a. In this case, the micro-LED may have each side with a length of about 1 to 100 μm inclusive, or about 3 to 10 μm inclusive.

Each pixel unit 3 may include a single light emitter 31. Each pixel unit 3 may include a subpixel unit including a light emitter 31R that emits red light, a subpixel unit including a light emitter 31G that emits green light, and a subpixel unit including a light emitter 31B that emits blue light. Each pixel unit 3 may include, instead of the subpixel unit including the light emitter 31R that emits red light, a subpixel unit including a light emitter that emits orange, red-orange, red-violet, or violet light. Each pixel unit 3 may include, instead of the subpixel unit including the light emitter 31G that emits green light, a subpixel unit including a light emitter that emits yellow-green light.

The power supply voltage feeder 4 is on the second surface 2b of the substrate 2. The power supply voltage feeder 4 includes a first power supply voltage terminal and a second power supply voltage terminal. The power supply voltage feeder 4 outputs a first power supply voltage VDD applicable to the pixel units 3 from the first power supply voltage terminal. The power supply voltage feeder 4 outputs a second power supply voltage VSS applicable to the pixel units 3 from the second power supply voltage terminal. The second power supply voltage VSS is lower in potential than the first power supply voltage VDD. The first power supply voltage VDD, which is a high-potential power supply voltage, is an anode voltage of, for example, about 10 to 15 V. The second power supply voltage VSS, which is a low-potential power supply voltage, is a cathode voltage of, for example, about 0 to 3 V.

The power supply voltage feeder 4 includes a control circuit for controlling the emission or non-emission state and the light intensity of the light emitters 31. The power supply voltage feeder 4 may be, for example, a thin film circuit on the second surface 2b of the substrate 2. In this case, the thin film circuit may include, for example, a semiconductor layer including low-temperature polycrystalline silicon (LTPS) formed directly on the second surface 2b by thin film deposition such as chemical vapor deposition (CVD). An IC chip may be mounted as a control circuit.

The display device 1 includes multiple scanning signal lines 7 arranged in each row in the matrix of the pixel units 3. The display device 1 includes multiple emission control signal lines 8 arranged in each column in the matrix of the pixel units 3. The scanning signal lines 7 and the emission control signal lines 8 are driven by the power supply voltage feeder 4. Fifth areas 25 are located in edge portions along the first side 2aa of the first surface 2a. Multiple electrode pads 71 electrically connected to the corresponding scanning signal lines 7 are located in the fifth areas 25. A sixth area 26 is located in an edge portion along one long side of the first surface 2a. Multiple electrode pads 81 electrically connected to the corresponding emission control signal lines 8 are located in the sixth area 26.

The first wiring conductor 5 is formed from a conductive material. The first wiring conductor 5 electrically connects the first power supply voltage terminal in the power supply voltage feeder 4 and the pixel units 3. The first wiring conductor 5 includes multiple first side conductors 51 and multiple second side conductors 52.

The first side conductors 51 are located in the first area 21 in the substrate 2. The first side conductors 51 may be formed from a conductive paste including conductive particles of, for example, Ag, Cu, Al, or stainless steel, an uncured resin component, an alcohol solvent, and water. The conductive paste may be applied to intended portions in the first area 21 and cured by heating, photocuring using ultraviolet (UV) ray irradiation, or a combination of photocuring and heating. The first side conductors 51 may also be formed by plating or thin film deposition, such as vapor deposition or CVD. The third surface 2c may have grooves in the portions to receive the first side conductors 51 in advance.

This allows the conductive paste that forms the first side conductors 51 to be easily received in the intended portions on the third surfaces 2c.

The second side conductors 52 are located in the second area 22 in the substrate 2. The material for the second side conductors 52 and the method of forming the second side conductors 52 are the same as the material for the first side conductors 51 and the method of forming the first side conductors 51, and will not be described in detail.

The second wiring conductor 6 is formed from a conductive material. The second wiring conductor 6 electrically connects the second power supply voltage terminal in the power supply voltage feeder 4 and the pixel units 3. The second wiring conductor 6 includes multiple third side conductors 61 and multiple fourth side conductors 62.

The third side conductors 61 are located in the third area 23 in the substrate 2. The material for the third side conductors 61 and the method of forming the third side conductors 61 are the same as the material for the first side conductors 51 and the method of forming the first side conductors 51, and will not be described in detail.

The fourth side conductors 62 are located in the fourth area 24 in the substrate 2. The material for the fourth side conductors 62 and the method of forming the fourth side conductors 62 are the same as the material for the first side conductors 51 and the method of forming the first side conductors 51, and will not be described in detail.

In the display device 1, the first wiring conductor 5 includes the first side conductors 51 in the first area 21 adjacent to the first side 2aa of the substrate 2 and the second side conductors 52 in the second area 22 adjacent to the second side 2ab of the substrate 2. The first side conductors 51 and the second side conductors 52 at both sides reduce the variation in the first power supply voltage VDD across the first surface 2a. In the display device 1, the second wiring conductor 6 includes the third side conductors 61 in the third area 23 adjacent to the first side 2aa of the substrate 2 and the fourth side conductors 62 in the fourth area 24 adjacent to the second side 2ab of the substrate 2. The third side conductors 61 and the fourth side conductors 62 at both sides reduce the variation in the second power supply voltage VSS across the first surface 2a. The display device 1 thus reduces the variation in the potential difference between the first power supply voltage VDD and the second power supply voltage VSS across the first surface 2a. This can reduce the likelihood of unevenness in luminance and display, thus improving the image quality.

In one example, the voltage distributions of the first power supply voltage VDD and the second power supply voltage VSS across the first surface 2a of the display device 1 according to the present embodiment are determined by computer simulation. This simulation uses the substrate 2 having the first surface 2a with a diagonal length of 9 inches. The substrate 2 includes 100 first side conductors 51 in the first area 21, 100 second side conductors 52 in the second area 22, 100 third side conductors 61 in the third area 23, and 100 fourth side conductors 62 in the fourth area 24. At a voltage of 15V applied as the first power supply voltage VDD and a voltage of 3V as the second power supply voltage VSS, the voltage distributions across the substrate are determined.

In a comparative example, a display device having the same structure as the display device 1 except for the absence of the second side conductors 52 and the fourth side conductors 62 is prepared, and the voltage distributions of the first power supply voltage VDD and the second power supply voltage VSS across the first surface 2a of the display device are determined by simulation.

FIG. 2A shows the voltage distribution of the first power supply voltage VDD in the display device 1 in the example. FIG. 2B shows the voltage distribution of the second power supply voltage VSS in the display device 1 in the example. FIG. 3A shows the voltage distribution of the first power supply voltage VDD in the display device in the comparative example. FIG. 3B shows the voltage distribution of the second power supply voltage VSS in the display device in the comparative example. In the figures, the voltage distributions are shown by shading, with the shading levels expressed in a voltage range indicated on the left. In FIG. 2A, the voltage value is 15.00 V at a high level and is 14.68 V at a low level, with a variation of 0.32 V in the distribution. Similarly, in FIG. 2B, the voltage value is 3.959 V at a high level and is 3.008 V at a low level, with a variation of 0.951 V in the distribution. In the comparative example, the voltage value has a variation of 0.88 V as shown in FIG. 3A, and the voltage value has a variation of 2.924 V as shown in FIG. 3B.

The simulation results in FIGS. 2A and 3A show that the variation in the first power supply voltage VDD across the first surface 2a is less in the display device 1 in the example than in the display device in the comparative example. The simulation results in FIGS. 2B and 3B show that the variation in the second power supply voltage VSS across the first surface 2a is less in the display device 1 in the example than in the display device in the comparative example. This shows that the variation in the potential difference between the first power supply voltage VDD and the second power supply voltage VSS across the first surface 2a is less in the display device 1 in the example than in the display device in the comparative example.

The structures of the first wiring conductor 5, the second wiring conductor 6, and the pixel units 3 in the display device 1 will now be described.

Figure 4A:
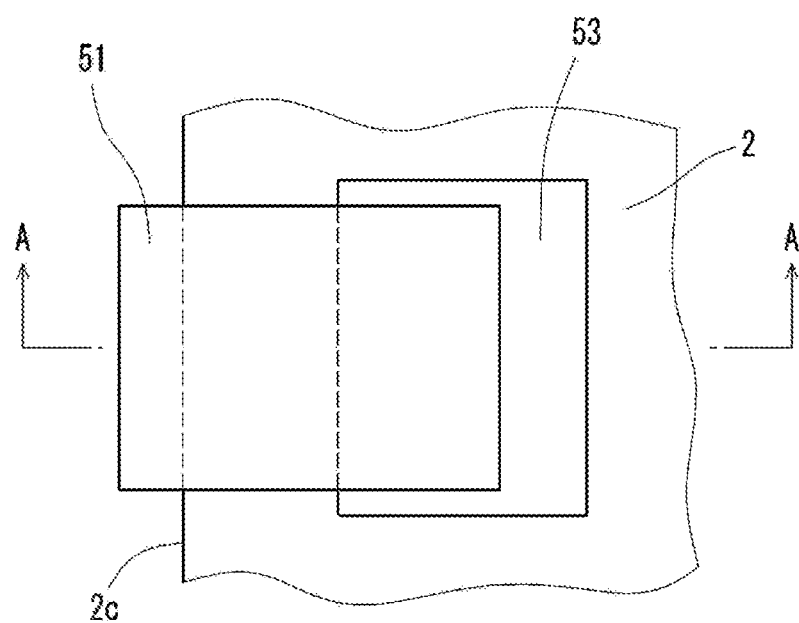
FIG. 4A is a schematic plan view of a first side conductor, a first electrode pad, and a second electrode pad in the display device according to the embodiment of the present disclosure.
Figure 4B:
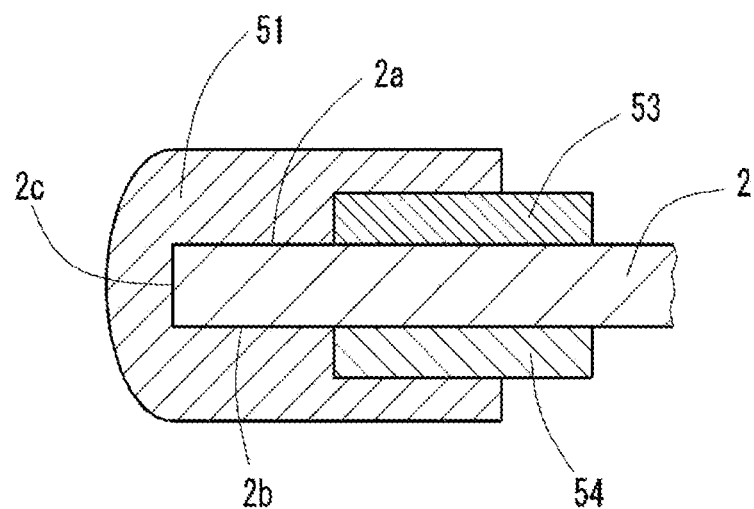
FIG. 4B is a cross-sectional view taken along line A-A in FIG. 4A.
Figure 4C:
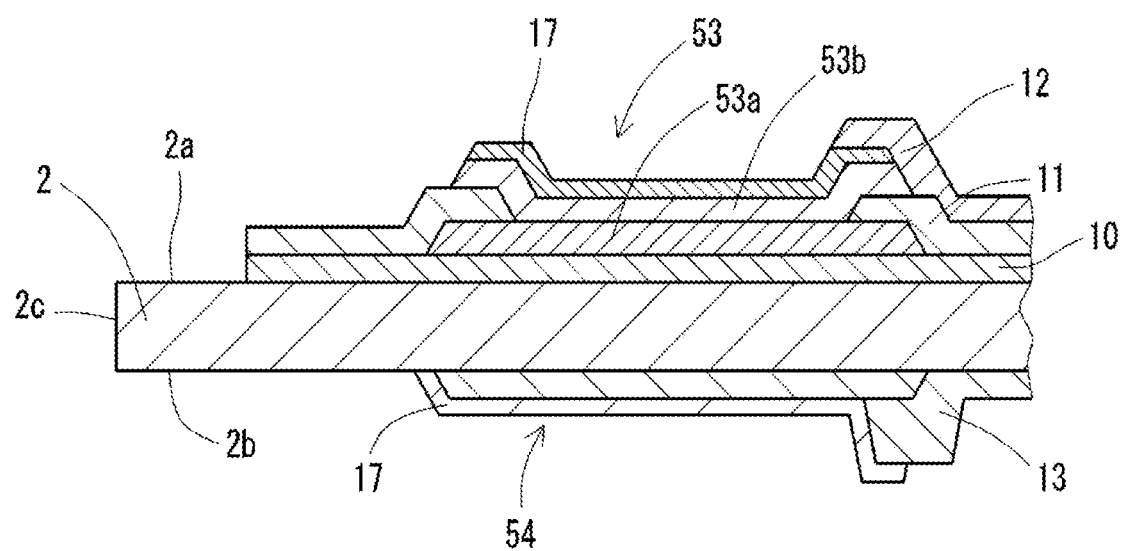
FIG. 4C is a cross-sectional view of the first side conductor, the first electrode pad, and the second electrode pad in the display device according to the embodiment of the present disclosure.
Figure 5A:
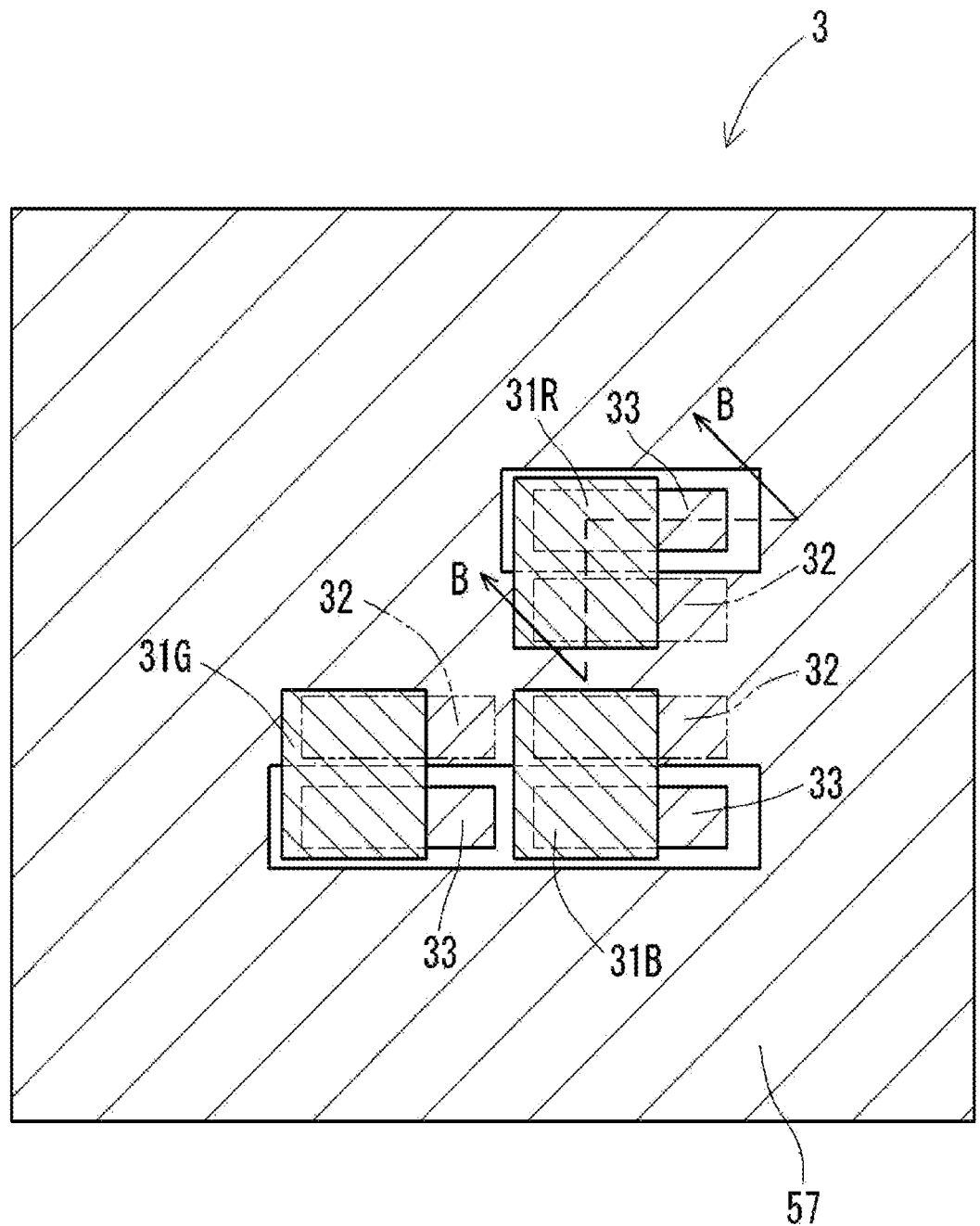
FIG. 5A is a plan view of a pixel unit in the display device according to the embodiment of the present disclosure.
Figure 5B:
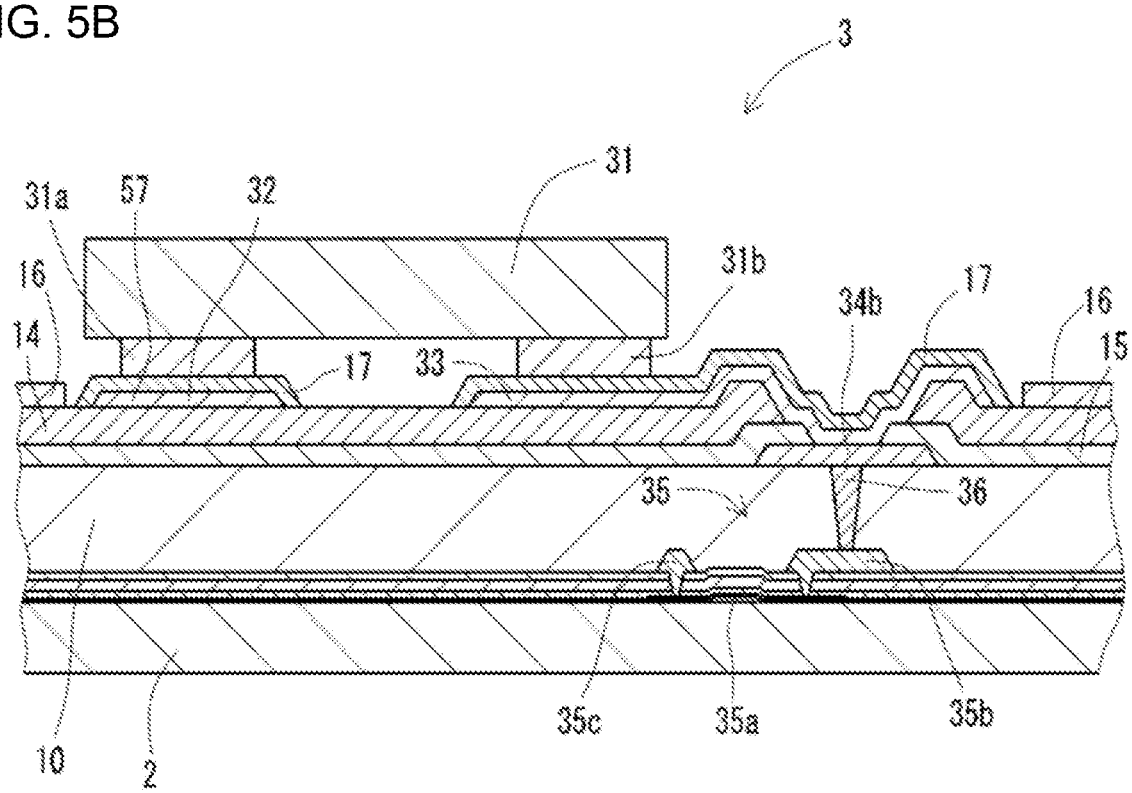
FIG. 5B is a cross-sectional view taken along line B-B in FIG. 5A.
Figure 5C:
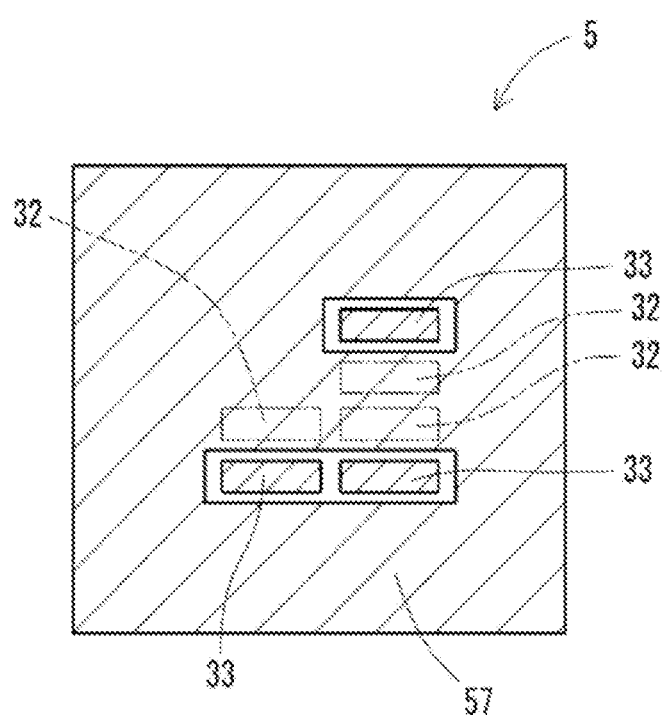
FIG. 5C is a plan view of a first wiring pattern in the display device according to the embodiment of the present disclosure.
Figure 5D:
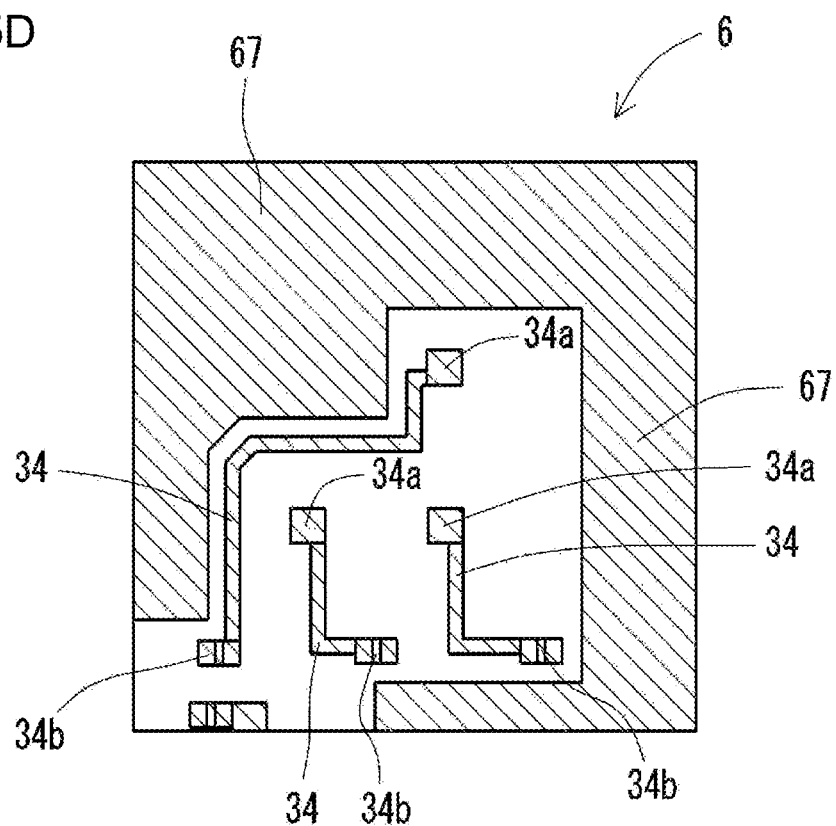
FIG. 5D is a plan view of a third wiring pattern in the display device according to the embodiment of the present disclosure.

FIG. 4A is a schematic plan view of the first side conductor 51, a first electrode pad 53, and a second electrode pad 54 in the display device according to the embodiment of the present disclosure. FIG. 4B is a cross-sectional view taken along line A-A in FIG. 4A. FIG. 4C is a cross-sectional view of the first side conductor 51, the first electrode pad 53, and the second electrode pad 54 in the display device according to the embodiment of the present disclosure. FIG. 5A is a plan view of a pixel unit in the display device according to the embodiment of the present disclosure. FIG. 5B is a cross-sectional view taken along line B-B in FIG. 5A. FIG. 5C is a plan view of a first wiring pattern in the display device according to the embodiment of the present disclosure. FIG. 5D is a plan view of a third wiring pattern in the display device according to the embodiment of the present disclosure.

The first wiring conductor 5 includes, in addition to the first side conductors 51 and the second side conductors 52, the multiple first electrode pads 53, the multiple second electrode pads 54, multiple third electrode pads 55, multiple fourth electrode pads 56, a first wiring pattern 57, and a second wiring pattern 58. As described later, the first wiring pattern 57 is on the first surface 2a. The first wiring pattern 57 includes a planar conductive portion formed entirely on the area for the pixel units excluding the first area 21, the second area 22, the third area 23, the fourth area 24, the fifth areas 25, and the sixth area 26. The second wiring pattern 58 includes linear conductive portions on the second surface.

The first electrode pads 53 are located in the first area 21 on the first surface 2a. The first electrode pads 53 are arranged along the first side 2aa as shown in, for example, FIG. 1A. The second electrode pads 54 are located in the first area 21 on the second surface 2b and overlap the corresponding first electrode pads 53 as viewed in plan.

A first electrode pad 53 on the first surface 2a and a second electrode pad 54 on the second surface 2b overlapping the first electrode pad 53 as viewed in plan are electrically connected with each other with a first side conductor 51 as shown in, for example, FIGS. 4A and 4B. The first electrode pads 53 are routed inward (rightward in FIGS. 4B and 4C) on the first surface 2a and connected to the first wiring pattern 57. The second electrode pads 54 are routed inward on the second surface 2b and connected to the second wiring pattern 58. A lower insulating layer 10 of, for example, $SiO_2$ or $Si_3N_4$ is located between the substrate 2 and the first electrode pads 53 as shown in, for example, FIG. 4C. Components such as a control element for controlling the pixel units 3 and a wiring conductor may be located in the lower insulating layer 10 or between the substrate 2 and the lower insulating layer 10.

The first electrode pad 53 and the second electrode pad 54 are formed from a conductive material. The first electrode pad 53 and the second electrode pad 54 may include a single metal layer, or multiple metal layers stacked on one another. FIG. 4C shows an example first electrode pad 53 including two metal layers 53a and 53b stacked on each other and an example second electrode pad 54 including a single metal layer.

The first electrode pad 53 and the second electrode pad 54 include, for example, Al, Al/Ti, Ti/Al/Ti, Mo, Mo/Al/Mo, MoNd/AlNd/MoNd, Cu, Cr, Ni, or Ag. The Al/Ti refers to a stack of a Ti layer on an Al layer. The same applies to the others.

The first electrode pad 53 and the second electrode pad 54 being a stack of multiple metal layers may partly include an insulating layer 11 between the metal layers as shown in, for example, FIG. 4C. The first electrode pad 53 may include an insulating layer 12 at its inward end on the first surface 2a, and the second electrode pad 54 may include an insulating layer 13 at its inward end on the first surface 2a as shown in, for example, FIG. 4C. This reduces the likelihood of short-circuiting between the first electrode pad 53 or the second electrode pad 54 and the wiring conductor located inward on the first surface 2a. The insulating layers 11, 12, and 13 are formed from, for example, $SiO_2$, $Si_3N_4$, or a polymeric material. The first electrode pad 53 and the second electrode pad 54 may have their surfaces coated with a transparent conductive layer 17 of, for example, indium tin oxide (ITO) or indium zinc oxide (IZO).

The third electrode pads 55 are located in the second area 22 on the first surface 2a. The fourth electrode pads 56 are located in the second area 22 on the second surface 2b and overlap the corresponding third electrode pads as viewed in plan.

A third electrode pad 55 on the first surface 2a and a fourth electrode pad 56 on the second surface 2b overlapping the third electrode pad 55 as viewed in plan are electrically connected with each other with a second side conductor 52. The structures of the second side conductor 52, the third electrode pad 55, and the fourth electrode pad 56 are the same as the structures of the first side conductor 51, the first electrode pad 53, and the second electrode pad 54, and will not be described in detail.

The first wiring pattern 57 electrically connects the pixel units 3 to the first electrode pads 53 and to the third electrode pads 55. The first wiring pattern 57 includes a planar conductive portion formed on substantially the entire first surface 2a without the conductive portion in specific areas as shown in, for example, FIG. 5C. The first wiring pattern 57 has openings in the areas for cathode pads 33 (described later) as shown in FIG. 5C. The positive electrodes (anode electrodes) of the light emitters 31 are electrically connected to anode pads being parts of the first wiring pattern 57. The negative electrodes (cathode electrodes) of the light emitters 31 are electrically connected to cathode pads in the openings in the first wiring pattern 57. The anode pads and the cathode pads are electrically insulated from each other.

The second wiring pattern 58 electrically connects the power supply voltage feeder 4 to the second electrode pads 54 and to the fourth electrode pads 56. The second wiring pattern 58 includes linear conductive portions on the second surface 2b as shown in, for example, FIG. 1B.

The first wiring pattern 57 and the second wiring pattern 58 include, for example, a single layer of Al or Ag or a multilayer of Mo/Al/Mo or MoNd/AlNd/MoNd.

The first wiring conductor 5 with the above structure can have a narrower resistance distribution with the wiring pattern including the planar conductive portion and can also input the voltage to the planar conductive portion from both sides, thus reducing the variation in the first power supply voltage VDD across the first surface 2a. This can reduce the likelihood of unevenness in luminance and display, thus improving the image quality.

The second wiring conductor 6 includes, in addition to the third side conductors 61 and the fourth side conductors 62, multiple fifth electrode pads 63, multiple sixth electrode pads 64, multiple seventh electrode pads 65, multiple eighth electrode pads 66, a third wiring pattern 67, and a fourth wiring pattern 68. The third wiring pattern 67 is on the first surface 2a. The third wiring pattern 67 includes a planar conductive portion formed on the area for the pixel units excluding the first area 21, the second area 22, the third area 23, the fourth area 24, the fifth areas 25, and the sixth area 26. The fourth wiring pattern 68 includes linear conductive portions on the second surface. The third wiring pattern 67 is formed in a layer different from the layer for the first wiring pattern on the first surface 2a with an insulating film between the layers.

The fifth electrode pads 63 are located in the third area 23 on the first surface 2a. The fifth electrode pads 63 are arranged along the first side 2aa as shown in, for example, FIG. 1A. The sixth electrode pads 64 are located in the third area 23 on the second surface 2b and overlap the corresponding fifth electrode pads 63 as viewed in plan.

A fifth electrode pad 63 on the first surface 2a and a sixth electrode pad 64 on the second surface 2b overlapping the fifth electrode pad 63 as viewed in plan are electrically connected with each other with a third side conductor 61. The structures of the third side conductor 61, the fifth electrode pad 63, and the sixth electrode pad 64 are the same as the structures of the first side conductor 51, the first electrode pad 53, and the second electrode pad 54, and will not be described in detail.

The seventh electrode pads 65 are located in the fourth area 24 on the first surface 2a. The seventh electrode pads 65 are arranged along the second side 2ab as shown in, for example, FIG. 1A. The eighth electrode pads 66 are located in the fourth area 24 on the second surface 2b and overlap the corresponding seventh electrode pads 65 as viewed in plan.

A seventh electrode pad 65 on the first surface 2a and an eighth electrode pad 66 on the second surface 2b overlapping the seventh electrode pad 65 as viewed in plan are electrically connected with each other with a fourth side conductor 62. The structures of the fourth side conductor 62, the seventh electrode pad 65, and the eighth electrode pad 66 are the same as the structures of the first side conductor 51, the first electrode pad 53, and the second electrode pad 54, and will not be described in detail.

The third wiring pattern 67 electrically connects the pixel units 3 to the fifth electrode pads 63 and to the seventh electrode pads 65. The third wiring pattern 67 includes a planar conductive portion formed on substantially the entire first surface 2a. The third wiring pattern 67 has openings in the areas for receiving the light emitters 31. The third wiring pattern 67 is nearer the first surface 2a located lower than the first wiring pattern 57. The first wiring pattern 57 and the third wiring pattern 67 are insulated from each other with insulating layers 14 and 15. The insulating layers 14 and 15 are formed from, for example, $SiO_2$, $Si_3N_4$, or a polymeric material.

The fourth wiring pattern 68 electrically connects the power supply voltage feeder 4 to the sixth electrode pads 64 and to the eighth electrode pads 66. The fourth wiring pattern 68 includes linear conductive portions on the second surface 2b as shown in, for example, FIG. 1B.

The third wiring pattern 67 and the fourth wiring pattern 68 include, for example, a single layer of Al or Ag or a multilayer of Mo/Al/Mo or MoNd/AlNd/MoNd.

The second wiring conductor 6 with the above structure can have a narrower resistance distribution with the wiring pattern including the planar conductive portion and can also input the voltage to the planar conductive portion from both sides, thus reducing the variation in the second power supply voltage VSS across the first surface 2a. This can reduce the likelihood of unevenness in luminance and display, thus improving the image quality.

The pixel units 3 each include the light emitter 31R that emits red light, the light emitter 31G that emits green light, and the light emitter 31B that emits blue light as shown in, for example, FIG. 5A. Each pixel unit 3 thus enables display of color tones.

The light emitters 31R, 31G, and 31B may be arranged in an L shape as viewed in plan as shown in, for example, FIG. 5A. This allows the pixel unit 3 to be smaller as viewed in plan, and to be compact and square as viewed in plan. The display device 1 thus includes pixels with higher density, enabling high-quality image display.

The light emitter 31 includes a positive electrode (anode electrode) 31a electrically connected to an anode pad 32 being a part of the first wiring pattern 57. The light emitter 31 includes a negative electrode (cathode electrode) 31b electrically connected to a cathode pad 33 included in the same layer as the first wiring pattern 57. The anode pad 32 and the cathode pad 33 are insulated from each other by the opening (cutout) around the cathode pad 33 in the first wiring pattern 57. The cathode pad 33 is electrically connected to a first end 34a of a routing wiring conductor 34 through a contact hole. The routing wiring conductors 34 are in the same layer as the third wiring pattern 67. The third wiring pattern 67 and the routing wiring conductors 34 in the same layer are insulated from each other by cutouts around the routing wiring conductors 34. A second end 34b of the routing wiring conductor 34 is electrically connected to a source electrode of a TFT for electrically driving the light emitter 31 as described later. Although not shown, the third wiring pattern 67 is electrically connected to the source electrodes of the TFTs through contact holes in the lower insulating layer 10 and applies the power supply voltage VSS to the pixel units 3.

The anode pad 32 and the cathode pad 33 may have their surfaces coated with the transparent conductive layer 17 of, for example, ITO or IZO. An insulating layer 16 of, for example, $SiO_2$, $Si_3N_4$, or a polymeric material may be arranged around the anode pad 32 and the cathode pad 33 as shown in, for example, FIG. 5B.

The display device 1 includes, on the first surface 2a of the substrate 2, the lower insulating layer 10 of an insulating material such as $SiO_2$ and $Si_3N_4$. The lower insulating layer 10 may include a single insulating layer, or multiple insulating layers stacked on one another. TFTs 35 are located between the substrate 2 and the lower insulating layer 10 as shown in, for example, FIG. 5B.

The TFT 35 is, for example, an n-channel TFT and is used as a driving element for driving the light emitter with a current. The TFT 35 is a three-terminal element having a gate electrode 35a as a gate terminal, a source electrode 35b as a source terminal, and a drain electrode 35c as a drain terminal. In the TFT 35, the source electrode 35b is electrically connected to the cathode pad 33 through a conductive connector 36 such as a through-hole as shown in, for example, FIG. 5B. The gate electrode 35a is electrically connected to a pixel node. The drain electrode 35c is electrically connected to the second end 34b of the routing wiring conductor 34 through a conductive connector such as a through-hole.

Example structures of the first to fourth areas in the display device according to the embodiment of the present disclosure will now be described.

The display device 1 includes the first area 21 apart from the third area 23 and the second area 22 apart from the fourth area 24 as shown in, for example, FIG. 1A. This reduces the likelihood of short-circuiting between the first wiring conductor 5 and the second wiring conductor 6. The display device can thus have improved reliability.

The display device 1 includes the first area 21 and the fourth area 24 apart from each other and the third area 23 and the second area 22 apart from each other as viewed in a direction orthogonal to the third surface 2c, as shown in, for example, FIG. 1A. Multiple display devices 1 may be arranged and tiled on the same plane. This can achieve a composite and large display device (hereafter also referred to as a multi-display). In this case, the third surface 2c of one display device 1 and the fourth surface 2d of another display device 1 may be connected together. This reduces the likelihood of short-circuiting between the first side conductors 51 and the fourth side conductors 62 and the likelihood of short-circuiting between the third side conductors 61 and the second side conductors 52. The multi-display can thus have improved reliability.

The display device 1 may include the first area 21 overlapping the second area 22 and the third area 23 overlapping the fourth area 24 as viewed in the direction orthogonal to the third surface 2c, as shown in, for example, FIG. 1A. This structure facilitates routing of the second wiring pattern 58 and the fourth wiring pattern 68 on the second surface 2b of the substrate 2.

As shown in, for example, FIG. 1A, the display device 1 may include the substrate 2 including a pair of fifth areas 25 in the edge portions along the first side 2aa on the first surface 2a that sandwich the first area 21 and the third area 23 in a direction along the first side 2aa. The multiple electrode pads 71 electrically connected to the corresponding scanning signal lines 7 may be located in the pair of fifth areas 25.

The first wiring conductor 5 applies the first power supply voltage VDD to the pixel units 3. The second wiring conductor 6 applies the second power supply voltage VSS to the pixel units 3. The first electrode pad 53 in the first wiring conductor 5 and the fifth electrode pad 63 in the second wiring conductor 6 may thus have larger surface areas than the electrode pad 71 electrically connected to the scanning signal line 7 to prevent heat from being generated or connection faults such as disconnection resulting from the heat in the first electrode pad 53 and the fifth electrode pad 63. In this case, the first area 21 in which the first electrode pads 53 are located and the third area 23 in which the fifth electrode pads 63 are located are separated from the fifth areas 25 in which the electrode pads 71 are located. This allows the first electrode pads 53, the fifth electrode pads 63, and the electrode pads 71 to be efficiently located.

A display device according to another embodiment of the present disclosure will now be described.

Figure 6:
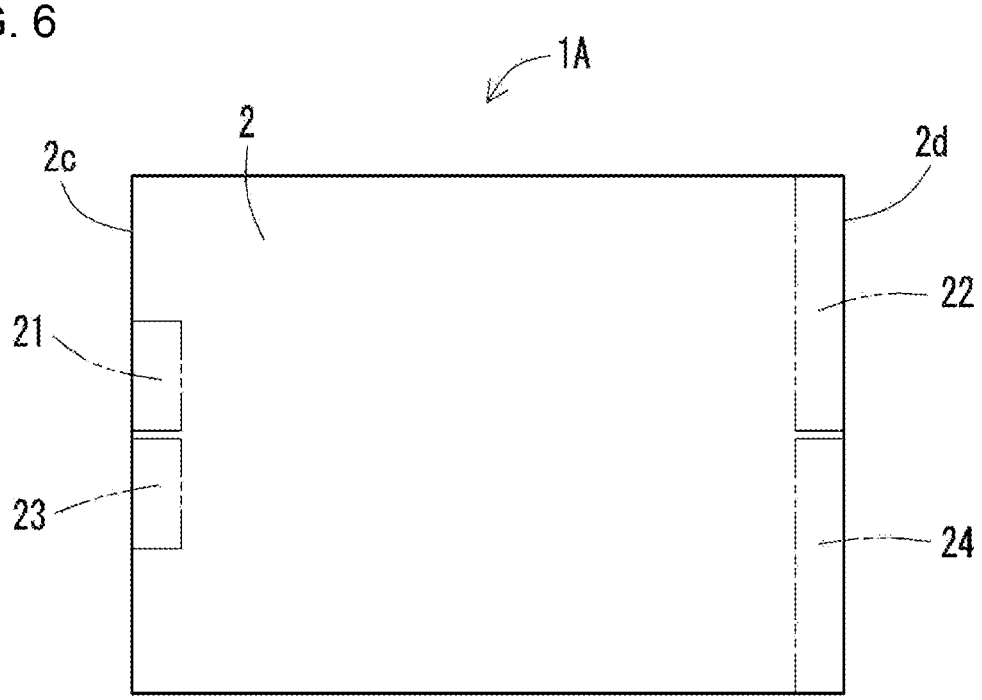
FIG. 6 is a schematic plan view of a display device according to another embodiment of the present disclosure.

FIG. 6 is a schematic plan view of the display device according to the other embodiment of the present disclosure. A display device 1A according to the present embodiment basically has the same structure as the display device 1 in the embodiment described above except for the structure of the first to fourth areas. The same components will not be shown and will not be described in detail.

Similarly to the display device 1, the display device 1A includes a first area 21 and a third area 23 apart from each other and a second area 22 and a fourth area 24 apart from each other. Similarly to the display device 1, the display device 1A includes the first area 21 overlapping the second area 22 and apart from the fourth area 24 as viewed in a direction orthogonal to a third surface 2c. Similarly to the display device 1, the display device 1A includes the third area 23 overlapping the fourth area 24 and apart from the second area 22 as viewed in the direction orthogonal to the third surface 2c.

As shown in, for example, FIG. 6, the display device 1A includes the second area 22 having a greater length along a second side 2ab than the length of the first area 21 along a first side 2aa. This structure allows use of more third electrode pads than first electrode pads or allows adjacent third electrode pads to have a greater distance between them than the distance between adjacent first electrode pads. This effectively reduces the variation in a first power supply voltage VDD across a first surface 2a. The electrode pad can be upsized. This can reduce the likelihood of unevenness in luminance and display, thus improving the image quality.

As shown in, for example, FIG. 6, the display device 1A includes the fourth area 24 with a greater length along the second side 2ab than the length of the third area 23 along the first side 2aa. This structure allows use of more seventh electrode pads than fifth electrode pads or allows adjacent seventh electrode pads to have a greater distance between them than the distance between adjacent fifth electrode pads. This effectively reduces the variation in a second power supply voltage VSS across the first surface 2a. The electrode pad can be upsized. This can reduce the likelihood of unevenness in luminance and display, thus improving the image quality.

Figure 7:
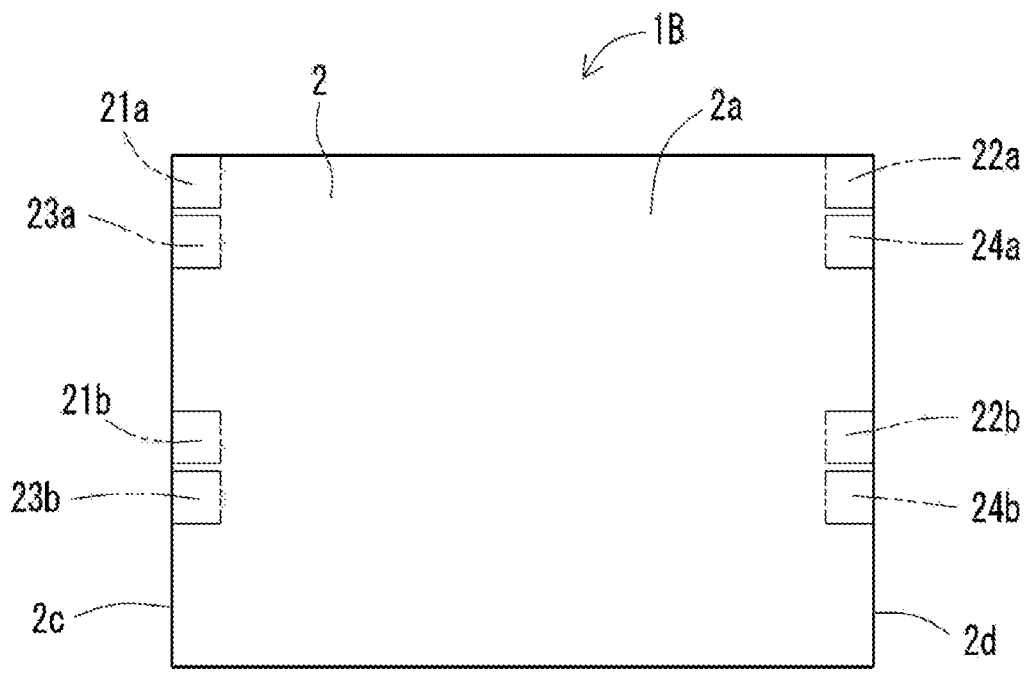
FIG. 7 is a schematic plan view of a display device according to another embodiment of the present disclosure.

FIG. 7 is a schematic plan view of a display device according to another embodiment of the present disclosure. A display device 1B according to the present embodiment basically has the same structure as the display device 1 in the embodiment described above except for the structure of the first to fourth areas. The same components will not be shown and will not be described in detail.

Similarly to the display device 1, the display device 1B includes a first area 21 and a third area 23 apart from each other and a second area 22 and a fourth area 24 apart from each other. Similarly to the display device 1, the display device 1B includes the first area 21 overlapping the second area 22 and apart from the fourth area 24 as viewed in a direction orthogonal to a third surface 2c. Similarly to the display device 1, the display device 1B includes the third area 23 overlapping the fourth area 24 and apart from the second area 22 as viewed in the direction orthogonal to the third surface 2c.

As shown in, for example, FIG. 7, the display device 1B may include the first area 21 including multiple first subareas 21a and 21b and the third area 23 including multiple third subareas 23a and 23b. This structure allows first electrode pads 53 and fifth electrode pads 63 to be located dispersedly in a direction along a first side 2aa. This effectively reduces the variation in a first power supply voltage VDD and a second power supply voltage VSS across a first surface 2a. This can reduce the likelihood of unevenness in luminance and display, thus improving the image quality. The first subareas 21a and 21b and the third subareas 23a and 23b may be arranged alternately along the first side 2aa as shown in, for example, FIG. 7.

As shown in, for example, FIG. 7, the display device 1B includes the second area 22 including multiple second subareas 22a and 22b and the fourth area 24 including multiple fourth subareas 24a and 24b. This structure allows third electrode pads 55 and seventh electrode pads 65 to be located dispersedly in a direction along a second side 2ab. This effectively reduces the variation in the first power supply voltage VDD and the second power supply voltage VSS across the first surface 2a. This can reduce the likelihood of unevenness in luminance and display, thus improving the image quality. The second subareas 22a and 22b and the fourth subareas 24a and 24b may be arranged alternately along the second side 2ab as shown in, for example, FIG. 7.

Figure 8:
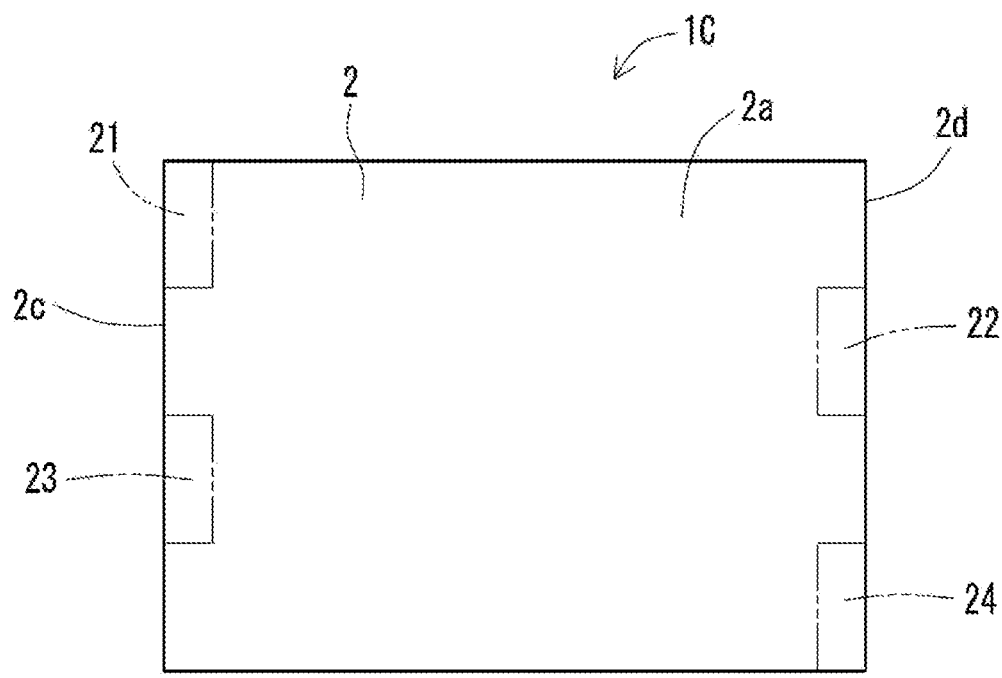
FIG. 8 is a schematic plan view of a display device according to another embodiment of the present disclosure.

FIG. 8 is a schematic plan view of a display device according to another embodiment of the present disclosure. A display device 1C according to the present embodiment basically has the same structure as the display device 1 in the embodiment described above except for the structure of the first to fourth areas. The same components will not be shown and will not be described in detail.

Similarly to the display device 1, the display device 1C includes a first area 21 and a third area 23 apart from each other and a second area 22 and a fourth area 24 apart from each other. Similarly to the display device 1, the display device 1C includes the first area 21 apart from the fourth area 24 and the third area 23 apart from the second area 22 as viewed in a direction orthogonal to a third surface 2c.

The display device 1C includes the first area 21 and the second area 22 apart from each other and the third area 23 and the fourth area 24 apart from each other as viewed in the direction orthogonal to the third surface 2c, as shown in, for example, FIG. 8. This structure allows first electrode pads 53 and fifth electrode pads 63 to be located dispersedly in a direction along a first side 2aa and allows third electrode pads and seventh electrode pads to be located dispersedly in a direction along a second side 2ab. This effectively reduces the variation in a first power supply voltage VDD and a second power supply voltage VSS across a first surface 2a, thus reducing the variation in the potential difference between the first power supply voltage VDD and the second power supply voltage VSS. This can reduce the likelihood of unevenness in luminance and display, thus improving the image quality.

A multi-display according to one embodiment of the present disclosure will now be described.

Figure 9:
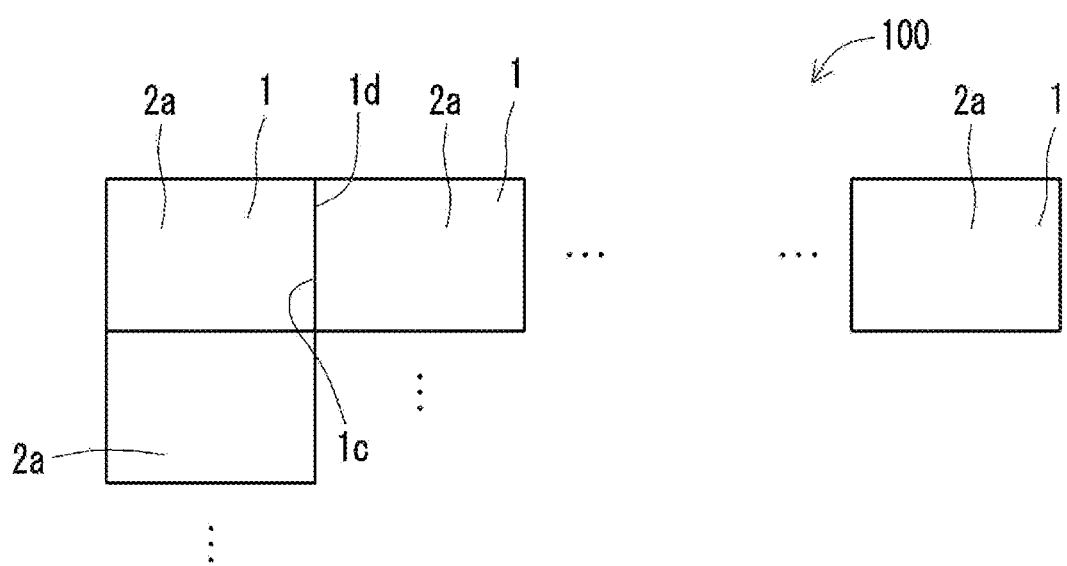
FIG. 9 is a schematic plan view of a multi-display according to one embodiment of the present disclosure.

FIG. 9 is a schematic plan view of the multi-display according to the embodiment of the present disclosure.

A multi-display 100 according to the present embodiment includes multiple display devices 1. The display devices 1 are arranged in a grid on the same plane with their first surfaces 2a facing in the same direction. Adjacent display devices 1 are connected together with their side surfaces bonded with, for example, an adhesive. The display devices 1 include a first display device 1 and a second display device 1. A third surface 1c of the first display device 1 and a fourth surface 1d of the second display device 1 are connected together.

The multi-display 100 including the multiple display devices 1 reduces the likelihood of unevenness in luminance and display, and can thus be a large multi-display with higher image quality. The multi-display 100 reduces the likelihood of short-circuiting between first side conductors 51 or second side conductors 52 in the first display device 1 and third side conductors 61 or fourth side conductors 62 in the second display device 1, and can thus be highly reliable.

Although the multi-display 100 includes the multiple display devices 1 in the embodiment described above, the multi-display 100 may include multiple display devices 1A, multiple display devices 1B, or multiple display devices 1C.

The present disclosure may be implemented in the following forms.

A display device according to one or more embodiments the present disclosure includes a plate-like substrate having a first surface and a second surface opposite to the first surface, a plurality of pixel units on the first surface, and a power supply voltage feeder on the second surface. The power supply voltage feeder outputs a first power supply voltage and a second power supply voltage applicable to the plurality of pixel units. The second power supply voltage is lower in potential than the first power supply voltage. The display device includes a first wiring conductor electrically connecting the power supply voltage feeder and the plurality of pixel units to apply the first power supply voltage to the plurality of pixel units and a second wiring conductor electrically connecting the power supply voltage feeder and the plurality of pixel units to apply the second power supply voltage to the plurality of pixel units. At least one of the first wiring conductor or the second wiring conductor includes a planar conductive portion covering the first surface. The planar conductive portion includes connectors connected to the power supply voltage feeder on at least two sides of the substrate.

The display device according to one or more embodiments of the present disclosure can reduce the variation in a potential difference between a high-potential power supply voltage and a low-potential power supply voltage. This can reduce the likelihood of unevenness in luminance and display, thus improving the image quality.

INDUSTRIAL APPLICABILITY

Although the embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises. The display device according to one or more embodiments of the present disclosure can be used in various electronic devices. Such electronic devices include, for example, composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, digital display watches, and smartwatches.

REFERENCE SIGNS LIST 1 display device
2 substrate
2a first surface
2aa first side
2ab second side
2b second surface
2c third surface
2d fourth surface
21 first area
21a, 21b first subarea
22 second area
22a, 22b second subarea
23 third area
23a, 23b third subarea
24 fourth area
24a, 24b fourth subarea
25 fifth area
26 sixth area
3 pixel unit
31, 31R, 31G, 31B light emitter
31a positive electrode
31b negative electrode
32 anode pad
33 cathode pad
34 routing wiring conductor
34a first end
34b second end
35 thin-film transistor (TFT)
35a gate electrode
35b source electrode
35c drain electrode
36 conductive connector
4 power supply voltage feeder
5 first wiring conductor
51 first side conductor
52 second side conductor
53 first electrode pad
53a, 53b metal layer
54 second electrode pad
55 third electrode pad
56 fourth electrode pad
57 first wiring pattern
58 second wiring pattern
6 second wiring conductor
61 third side conductor
62 fourth side conductor
63 fifth electrode pad
64 sixth electrode pad
65 seventh electrode pad
66 eighth electrode pad
67 third wiring pattern
68 fourth wiring pattern
7 scanning signal line 71 electrode pad
8 emission control signal line
81 electrode pad
10 lower insulating layer
11, 12, 13, 14, 15, 16 insulating layer
17 transparent conductive layer
100 multi-display

The invention claimed is:

1. A display device, comprising:
a substrate having a first surface and a second surface opposite to the first surface;
a plurality of pixel units on the first surface;
a power supply voltage feeder on the second surface, the power supply voltage feeder being configured to output a first power supply voltage and a second power supply voltage applicable to the plurality of pixel units, the second power supply voltage being lower in potential than the first power supply voltage;
a first wiring conductor electrically connecting the power supply voltage feeder and the plurality of pixel units, the first wiring conductor being configured to apply the first power supply voltage to the plurality of pixel units; and
a second wiring conductor electrically connecting the power supply voltage feeder and the plurality of pixel units, the second wiring conductor being configured to apply the second power supply voltage to the plurality of pixel units,
wherein at least one of the first wiring conductor or the second wiring conductor includes a planar conductive portion covering the first surface,
the planar conductive portion includes connectors connected to the power supply voltage feeder on at least two sides of the substrate,
the substrate has a third surface connecting the first surface and the second surface on a first side of the first surface and a fourth surface opposite to the third surface,
the first wiring conductor includes
a plurality of first side conductors in a first area extending from an edge portion along the first side on the first surface over the third surface and to the second surface, and
a plurality of second side conductors in a second area extending from an edge portion along a second side opposite to the first side on the first surface over the fourth surface and to the second surface, and
the second wiring conductor includes
a plurality of third side conductors in a third area extending from an edge portion along the first side on the first surface over the third surface and to the second surface, and
a plurality of fourth side conductors in a fourth area extending from an edge portion along the second side on the first surface over the fourth surface and to the second surface.

2. The display device according to claim 1, wherein
the first wiring conductor further includes
a plurality of first electrode pads in the first area on the first surface,
a plurality of second electrode pads in the first area on the second surface, the plurality of second electrode pads each overlapping a corresponding first electrode pad of the plurality of first electrode pads as viewed in plan,
a plurality of third electrode pads in the second area on the first surface,
a plurality of fourth electrode pads in the second area on the second surface, the plurality of fourth electrode pads each overlapping a corresponding third electrode pad of the plurality of third electrode pads as viewed in plan,
a first wiring pattern on the first surface, the first wiring pattern electrically connecting the plurality of pixel units to the plurality of first electrode pads and to the plurality of third electrode pads, and
a second wiring pattern on the second surface, the second wiring pattern electrically connecting the power supply voltage feeder to the plurality of second electrode pads and to the plurality of fourth electrode pads,
the plurality of first side conductors each connect a corresponding first electrode pad of the plurality of first electrode pads and a corresponding second electrode pad of the plurality of second electrode pads, and
the plurality of second side conductors each connect a corresponding third electrode pad of the plurality of third electrode pads and a corresponding fourth electrode pad of the plurality of fourth electrode pads.

3. The display device according to claim 1, wherein
the second wiring conductor further includes
a plurality of fifth electrode pads in the third area on the first surface,
a plurality of sixth electrode pads in the third area on the second surface, the plurality of sixth electrode pads each overlapping a corresponding fifth electrode pad of the plurality of fifth electrode pads as viewed in plan,
a plurality of seventh electrode pads in the fourth area on the first surface,
a plurality of eighth electrode pads in the fourth area on the second surface, the plurality of eighth electrode pads each overlapping a corresponding seventh electrode pad of the plurality of seventh electrode pads as viewed in plan,
a third wiring pattern on the first surface, the third wiring pattern electrically connecting the plurality of pixel units to the plurality of fifth electrode pads and to the plurality of seventh electrode pads, and
a fourth wiring pattern on the second surface, the fourth wiring pattern electrically connecting the power supply voltage feeder to the plurality of sixth electrode pads and to the plurality of eighth electrode pads,
the plurality of third side conductors each connect a corresponding fifth electrode pad of the plurality of fifth electrode pads and a corresponding sixth electrode pad of the plurality of sixth electrode pads, and
the plurality of fourth side conductors each connect a corresponding seventh electrode pad of the plurality of seventh electrode pads and a corresponding eighth electrode pad of the plurality of eighth electrode pads.

4. The display device according to claim 2, wherein the first area and the third area are spaced from each other and the second area and the fourth area are spaced from each other.

5. The display device according to claim 4, wherein the first area and the fourth area are spaced from each other and the third area and the second area are spaced from each other as viewed in a direction orthogonal to the third surface.

6. The display device according to claim 5, wherein the first area overlaps the second area and the third area overlaps the fourth area as viewed in the direction orthogonal to the third surface.

7. The display device according to claim 5, wherein the first area and the second area are spaced from each other and the third area and the fourth area are spaced from each other as viewed in the direction orthogonal to the third surface.

8. The display device according to claim 1, further comprising:
   a plurality of scanning signal lines on the first surface,
   wherein the substrate includes a pair of fifth areas in edge portions along the first side on the first surface, and the pair of fifth areas sandwich the first area and the third area in a direction along the first side, and
   a plurality of electrode pads are located in the pair of fifth areas, and each of the plurality of electrode pads is electrically connected to a corresponding scanning signal line of the plurality of scanning signal lines.

9. The display device according to claim 1, wherein the substrate is plate-like and rectangular, the first surface is rectangular, and the first side and the second side are short sides.

10. The display device according to claim 1, wherein each of the plurality of pixel units includes at least one micro-light-emitting diode.

11. The display device according to claim 10, wherein the planar conductive portion has an opening for at least one electrode of the at least one micro-light-emitting diode in each of the plurality of pixel units.

* * * * *